(12) United States Patent
Igarashi et al.

(10) Patent No.: US 8,979,463 B2
(45) Date of Patent: Mar. 17, 2015

(54) LOAD PORT APPARATUS

(75) Inventors: Hiroshi Igarashi, Tokyo (JP); Toshihiko Miyajima, Tokyo (JP)

(73) Assignee: TDK Corporation, Tokyo (JP)

( * ) Notice: Subject to any disclaimer, the term of this patent is extended or adjusted under 35 U.S.C. 154(b) by 634 days.

(21) Appl. No.: 13/228,891

(22) Filed: Sep. 9, 2011

(65) Prior Publication Data
US 2012/0063869 A1 Mar. 15, 2012

(30) Foreign Application Priority Data

Sep. 10, 2010 (JP) ................................. 2010-202676

(51) Int. Cl.
*H01L 21/677* (2006.01)

(52) U.S. Cl.
CPC ....... *H01L 21/67772* (2013.01); *Y10S 414/135* (2013.01)
USPC .......................................... 414/217; 414/935

(58) Field of Classification Search
CPC .................. H01L 21/67742; H01L 21/67201; H01L 21/67772; H01L 21/68707; H01L 21/67748; H01L 21/67775; H01L 21/67745; H01L 21/67778; H01L 21/67769
USPC ...................... 414/217, 935, 940; 49/258, 260
See application file for complete search history.

(56) References Cited

U.S. PATENT DOCUMENTS

| | | | | | |
|---|---|---|---|---|---|
| 6,955,197 | B2 * | 10/2005 | Elliott et al. | ..................... | 141/98 |
| 6,984,839 | B2 * | 1/2006 | Igarashi et al. | .......... | 250/559.33 |
| 7,654,291 | B2 * | 2/2010 | Miyajima et al. | ............... | 141/63 |
| 2002/0006322 | A1 * | 1/2002 | Perlov et al. | .................. | 414/217 |
| 2005/0265812 | A1 | 12/2005 | Suzuki et al. | | |
| 2007/0081632 | A1 * | 4/2007 | Fadler | .......................... | 378/193 |

FOREIGN PATENT DOCUMENTS

| | | |
|---|---|---|
| JP | 2004-47839 | 2/2004 |
| JP | 2006-173510 A | 6/2006 |

OTHER PUBLICATIONS

Japanese Office Action Issued Jul. 25, 2012 in Patent Application No. 2010-202676 (with English translation).
U.S. Appl. No. 13/212,576, filed Aug. 18, 2011, Igarashi, et al.
U.S. Appl. No. 14/259,797, filed Apr. 23, 2014, Miyajima, et al.

* cited by examiner

*Primary Examiner* — Saul Rodriguez
*Assistant Examiner* — Glenn Myers
(74) *Attorney, Agent, or Firm* — Oblon, Spivak, McClelland, Maier & Neustadt, L.L.P.

(57) ABSTRACT

To prevent an overload from being imposed on a door drive mechanism when driving a door increased in weight due to upsizing so that reproducibility of a stop position of the door can be ensured, provided is a load port apparatus in which the door drive mechanism for driving the door in a direction perpendicular to an opening-portion forming plane is constituted by: a rotary cylinder capable of pivoting a cam follower from an angle of 0° to an angle of 180°; and a slider including a cam groove capable of housing the cam follower within a plane perpendicular to a rotational axis of the rotary cylinder, the cam groove extending in a vertical direction, and in which the door is supported by the slider.

7 Claims, 4 Drawing Sheets

LOAD PORT APPARATUS

BACKGROUND OF THE INVENTION

1. Field of the Invention

The present invention relates to what is called a front-opening interface mechanical standard (FIMS) system, that is, a load port apparatus, which is used for transferring, from one semiconductor processing apparatus to another semiconductor processing apparatus, wafers held in a sealed-type transport container called a pod, or for transferring the wafers from the semiconductor processing apparatus to the pot, during a semiconductor manufacturing process and the like. More particularly, the present invention relates to a load port apparatus, which has a feature in an incorporated drive mechanism for opening and closing a door.

2. Description of the Related Art

In recent years, in a general semiconductor manufacturing process, cleanliness is managed throughout the entire process by maintaining a highly clean state in only the following three spaces: inner spaces of various processing apparatuses; an inner space of a pod capable of housing wafers and transporting the wafers from one processing apparatus to another processing apparatus; and a mini-environment in which the wafers are exchanged between the pod and the respective processing apparatuses. Such a pod includes a main-unit portion which houses wafers therein and which has a wafer-insertion-and-removal opening formed in one side surface, and a lid which makes the inside of the pod serve as a sealed space by closing the opening. Further, a structure that defines the mini-environment includes an opening portion capable of facing the above-mentioned opening of the pod and a second opening portion arranged on a semiconductor processing-apparatus side so as to face the opening portion.

The load port apparatus includes a member as a partition wall provided with the opening portion, that is, a wall called a side base, a door for closing the opening portion, a door drive mechanism for controlling operation of the door, and a mount table on which the pod is to be placed. A placing base is capable of supporting the pod in such a manner as to face the opening of the pod and the opening portion each other, and brings the lid of the pod close to or separated from the door together with the pod itself. The door is capable of holding the lid of the pod. The door drive mechanism causes the door to open and close the opening portion under a state of holding the lid, and the door is caused to retract below a space between the opening portion and the second opening portion or to enter the space. A robot is arranged in the mini-environment, and the robot is capable of entering into and retracting from the inside of the pod through the opening portion and the opening of the pod, and transfers wafers between the inside of the pod and the semiconductor processing apparatus also through the second opening portion.

In semiconductor manufacturing steps, an increase in a bore diameter of wafers to be used has been promoted for higher productivity. Therefore, each of the above-mentioned pod, mini-environment, and inner space in the processing apparatus is also upsized, and accordingly there is also a demand for an enlargement of the opening portion of the load port apparatus and upsizing of the door along with the enlargement. Such upsizing of the door involves an increase in weight of the door, and further the door drive mechanism is required to have a larger actuation force according to the increased weight of the door. As a conventional door drive mechanism, there is known a structure constituted by a servomotor, a ball screw, and the like, which is disclosed in Japanese Patent Application Laid-Open No. 2004-047839.

In a case where the weight of the door or the like increases, the required drive force of the drive mechanism also increases inevitably. However, in a case where the door is directly driven by using a motor that generates such a large drive force, when there arises a problem with position control, for example, an overload is imposed on a gear or the like, and in the extreme, there is a risk that the door, the door drive mechanism, or the like is damaged. Further, in a case of the configuration in which the door abuts against the pod at the time of loading the pod, for example, highly accurate position control is required for the door or the pod in consideration of the above-mentioned overload problem. In this case, the magnitude of the drive force may be a negative factor in an attempt to increase the accuracy of the stop position of the door or the like, and therefore there is a demand to establish stop position control different from the conventional control.

SUMMARY OF THE INVENTION

The present invention has been made in view of the above-mentioned circumstances, and it is therefore an object of the present invention to provide a load port apparatus including a drive mechanism, being capable of reliably opening and closing an upsized door, and preventing an overload from being imposed on components thereof even at the time of abnormality, and enabling the door to open and close an opening portion with high accuracy.

In order to achieve the above-mentioned object, the present invention provides a load port apparatus, which is to be mounted to a attached surface of a semiconductor processing apparatus to form an opening portion for insertion and removal of an object-to-be-processed, and which opens and closes a lid of a pod as a sealed container arranged on an outside of the semiconductor processing apparatus with respect to the attached surface so that the object-to-be-processed is insertable into and removable from an inside of the pod through the opening portion, the load port apparatus including: a mount table on which the pod is to be placed; a door which is capable of holding the lid of the pod in a state of being placed on the mount table, the door opening and closing the opening portion from an interior side of the semiconductor processing apparatus with respect to the attached surface; and a door drive mechanism which supports the door and causes the door to open and close the opening portion, in which the door drive mechanism includes: a slider which is movable along a predetermined trace and supports the door, the slider including a cam groove extending in a direction in which the cam groove intersects, at a predetermined intersection angle, a straight line connecting one end portion and another end portion of the predetermined trace; and a drive source which supports a cam follower engaging with the cam groove and causes the cam follower to rotate within a predetermined angle range about a rotational center which is a rotational axis arranged at a position spaced apart from the cam follower, and in which the rotational axis of the drive source faces the slider.

Note that, in the above-mentioned load port apparatus, it is preferred that, at both ends of the predetermined angle range, the predetermined intersection angle include a right angle, and tangential lines of a trace of the rotation of the cam follower be orthogonal to the straight line connecting the one end portion and the another end portion of the predetermined trace.

Further, the present invention provides a load port apparatus, which is to be mounted to a attached surface of a semiconductor processing apparatus to form an opening portion for insertion and removal of an object-to-be-processed, and which opens and closes a lid of a pod as a sealed container arranged on an outside of the semiconductor processing apparatus with respect to the attached surface so that the object-to-be-processed is insertable into and removable from an inside of the pod through the opening portion, the load port apparatus including: a mount table on which the pod is to be placed; a door which is capable of holding the lid of the pod in a state of being placed on the mount table, the door opening and closing the opening portion from an interior side of the semiconductor processing apparatus with respect to the attached surface; and a door drive mechanism which supports the door and causes the door to open and close the opening portion, in which the door drive mechanism includes: a slider which is movable in a horizontal direction and supports the door, the slider including a cam groove extending in a vertical direction; and a drive source constituted by a rotary cylinder which includes a cam follower engaging with the cam groove and causes the cam follower to rotate within a predetermined angle range about a rotational center which is a rotational axis arranged at a position different from a position of the cam follower, and in which the predetermined angle range is a range from a horizontal angle of 0° to a horizontal angle of 180° through a vertical, upper angle of 90° with respect to the rotational axis.

Note that, it is preferred that the above-mentioned load port apparatus further include a rotary-cylinder-position adjustment mechanism capable of adjusting a position of the rotary cylinder along an advancing-and-retracting direction of the door. Further, it is preferred that, at both ends of the predetermined angle range, an extending direction of the cam groove and tangential lines of a trace of the rotation of the cam follower be orthogonal to an operating direction of the slider at a time when the door drive mechanism causes the door to open and close the opening portion. Further, it is preferred that the cam groove intersect a predetermined trace, and, when the cam follower is situated at one of both ends of the predetermined angle range, the cam follower be situated in a lower end portion of the cam groove.

In the above-mentioned load port apparatus, it is more preferred that the above-mentioned slider and the above-mentioned drive source of the door drive mechanism constitute a first door drive unit for driving the door in a direction perpendicular to the attached surface, and the door drive mechanism further include a second door drive unit which supports the first door drive unit and drives the first door drive unit in a direction different from the direction in which the first door drive unit drives the door.

According to the present invention, even when the driving of the door is abnormal, the overload is prevented from being imposed on the door drive mechanism or the like. Further, the stop position control for the door is facilitated, and unlike the conventional configuration, even when the drive source is stopped, the stop position of the door can be maintained against the external force. In addition, at the time of opening and closing the door, the moving speed thereof is lower at the operational ends and is higher in the midst of the operation. Thus, the drive speed of the door can be increased easily.

Further features of the present invention will become apparent from the following description of exemplary embodiments with reference to the attached drawings.

DESCRIPTION OF THE EMBODIMENT

Figure 1:
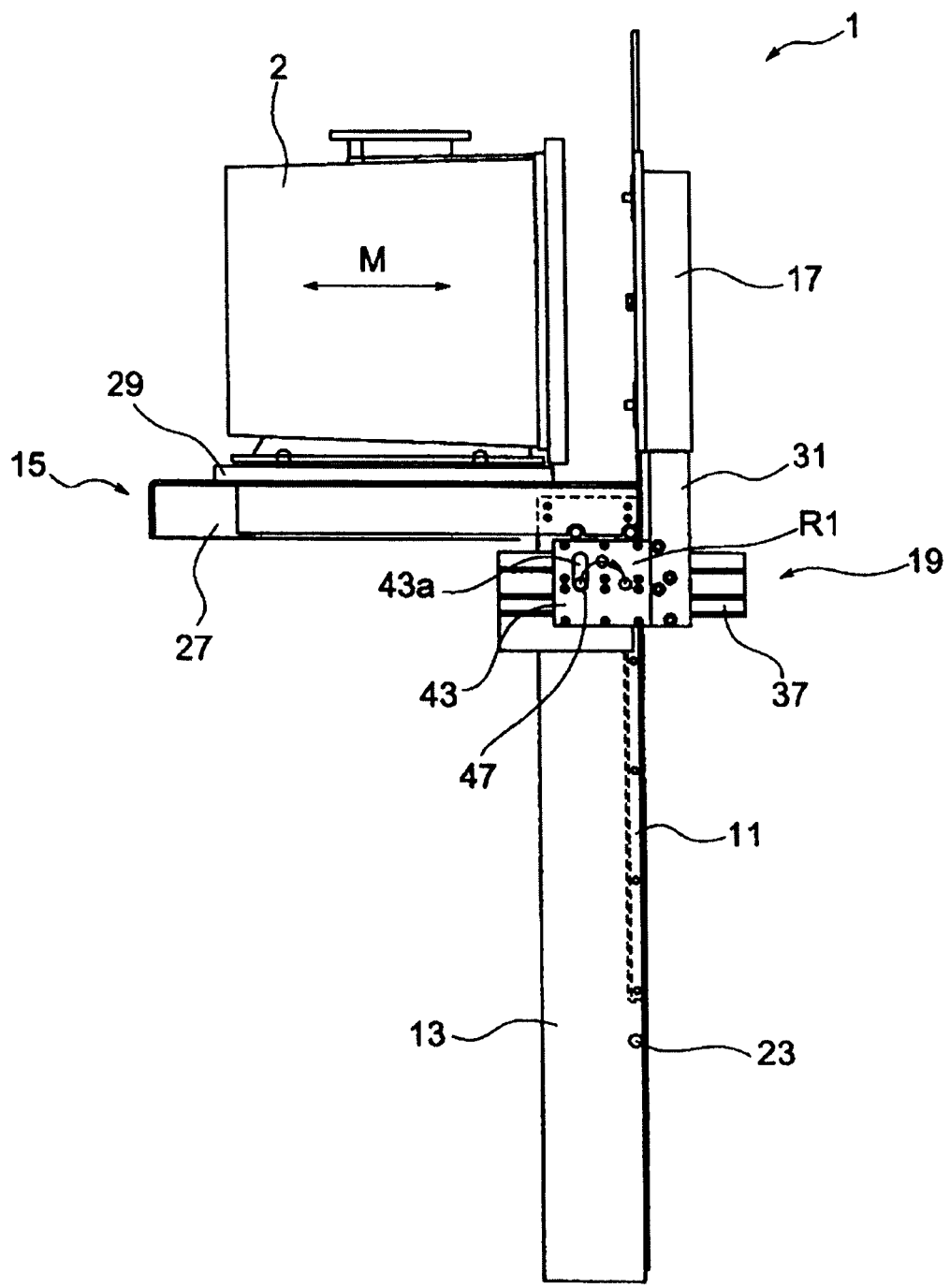
FIG. 1 is a view illustrating, from a side-surface side, a schematic configuration of a load port apparatus according to an embodiment of the present invention, under a state in which a pod is placed on the load port apparatus.
Figure 2:
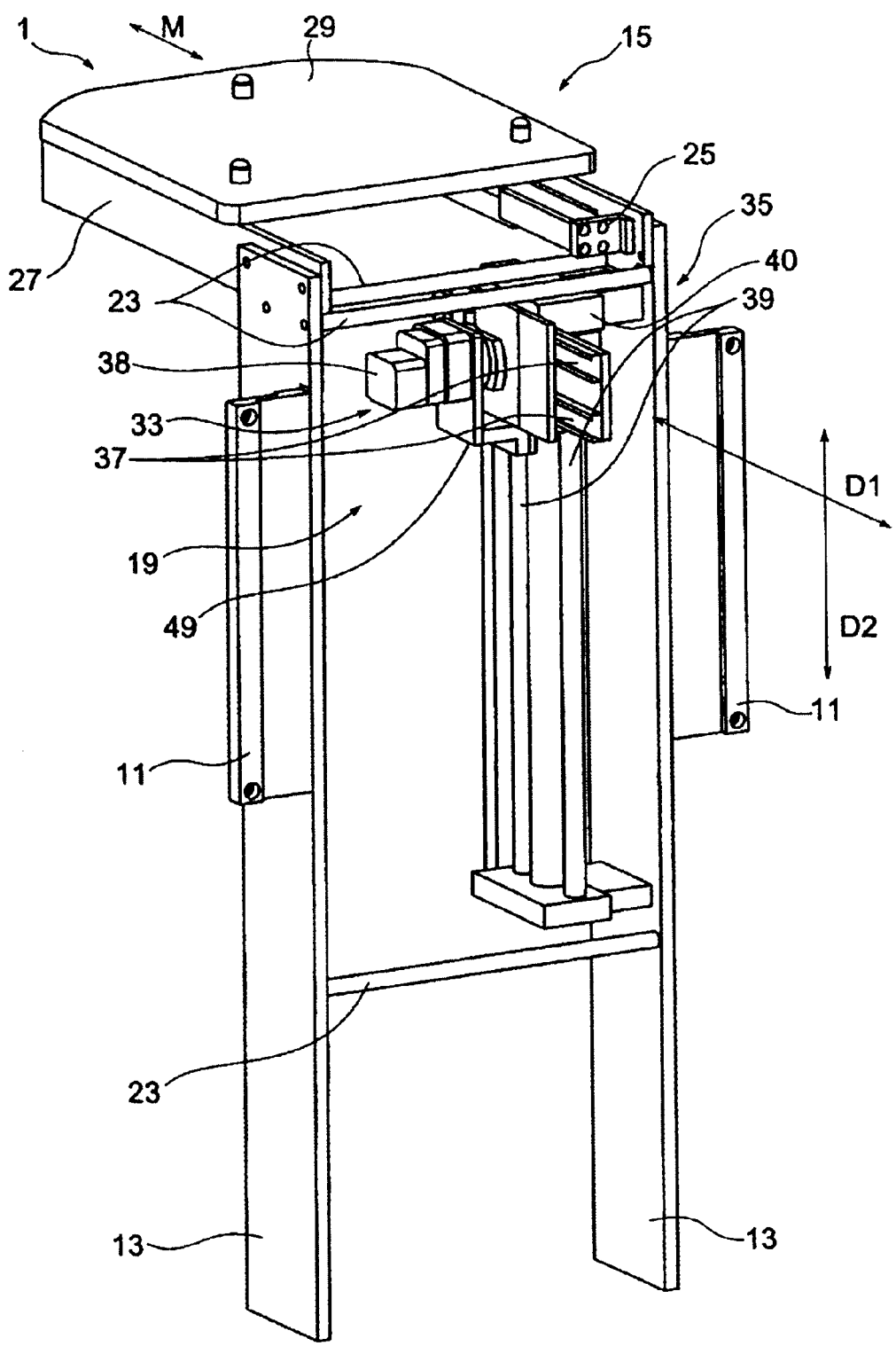
FIG. 2 is a perspective view illustrating the schematic configuration illustrated in FIG. 1 from a attached surface side situated on a semiconductor-processing-apparatus side, under a state in which a door is removed for simplicity of description.
Figure 3:
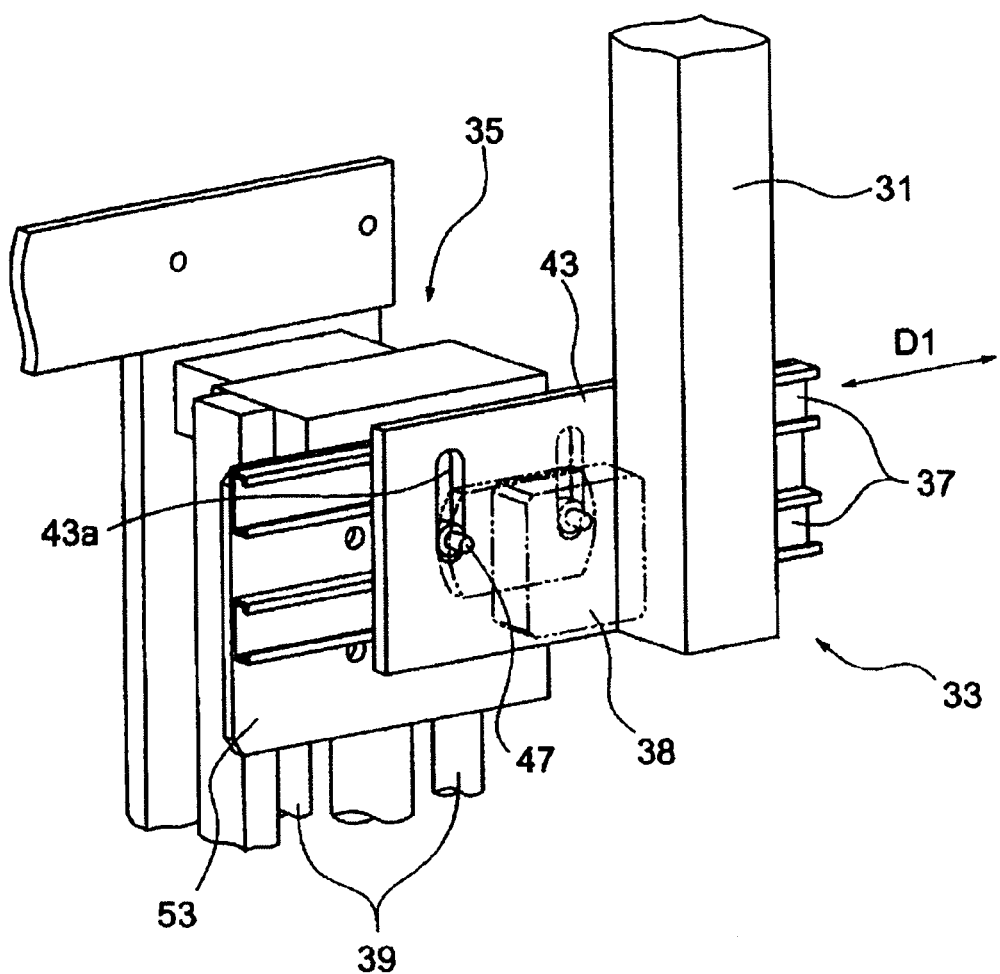
FIG. 3 is a perspective view schematically illustrating a main part configuration of first and second drive units in the configuration illustrated in FIG. 1.
Figure 4:
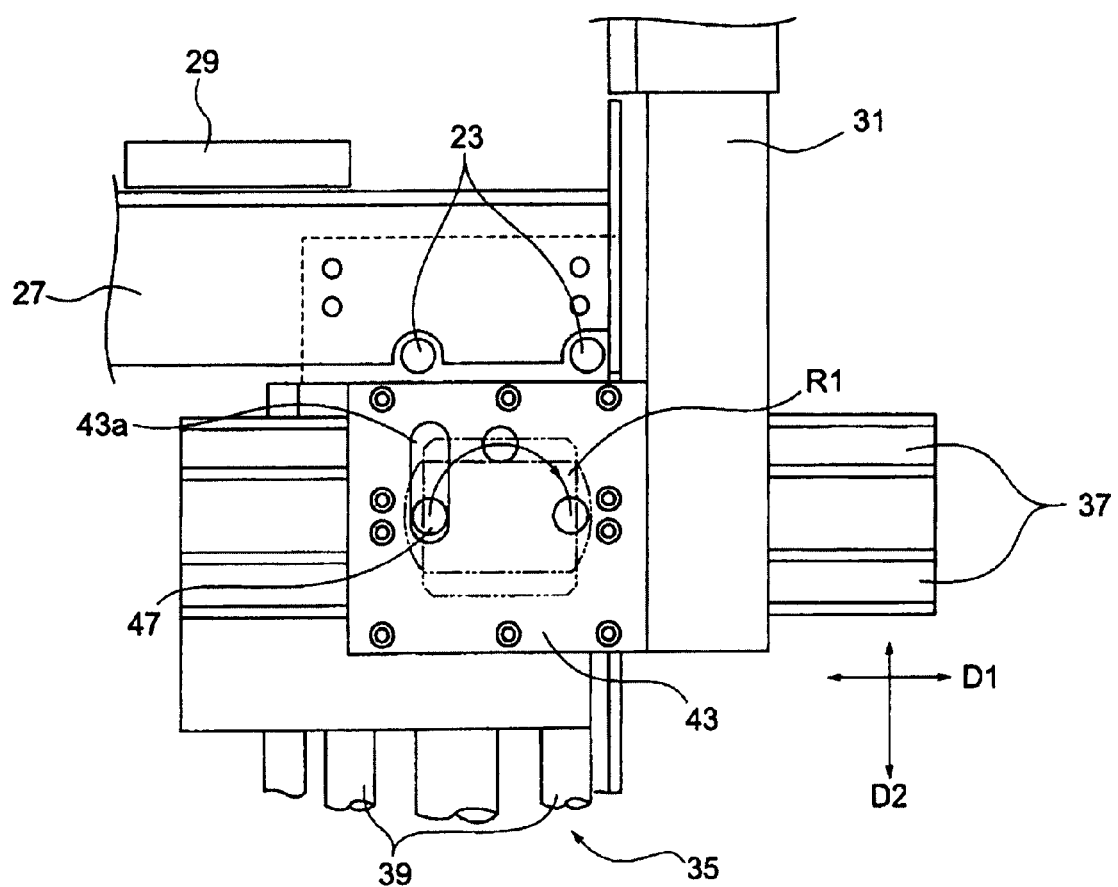
FIG. 4 is a side view schematically illustrating the main part configuration of the first and second drive units in the configuration illustrated in FIG. 1.

In the following, an embodiment of the present invention is described with reference to figures. FIG. 1 illustrates, from a side-surface side, a schematic configuration of a load port apparatus according to the embodiment of the present invention, under a state in which a pod 2 is placed on a mount table. Further, FIG. 2 is a perspective view illustrating, from an attached surface side to which the load port apparatus is attached, the schematic configuration of the load port apparatus under a state in which a door is removed for simplicity of description. FIG. 3 is a partially-transparent, enlarged view of a first door drive unit 33 and a second door drive unit 35. FIG. 4 is an enlarged view of the first door drive unit 33 and the second door drive unit 35 when viewed from a direction in which the first door drive unit 33 is arranged under a state in which a first drive source 38 is removed from the first door drive unit 33.

A load port apparatus 1 in this embodiment includes I-shaped connecting plates 11, main bases 13, a mount table 15, a door 17, and a door drive mechanism 19. Note that, in an actual structure, a cover (not shown) for covering the door drive mechanism 19 and a pod drive mechanism 25 which is affixed to the mount table 15 so as to prevent dust scattering therefrom is arranged under the mount table 15. The cover defines a sealed space for housing those components. Further, the semiconductor processing apparatus having the attached surface provided with an opening portion does not have a direct relation to this embodiment. Thus, the semiconductor processing apparatus is not described here with reference to figures.

Note that, the attached surface described in the following is one surface of a wall communicating a mini-environment in the above-mentioned semiconductor processing apparatus to an external space. Further, the attached surface is a surface of the semiconductor processing apparatus having the above-mentioned mini-environment inside, which faces the outside. The load port apparatus according to the present invention is mounted and fixed to the attached surface that is an outer surface of a casing of the semiconductor processing apparatus through the intermediation of a connecting member or the like.

Next, the individual components are described. Each of the main bases 13 is formed of a plate-like body, and is supported by the connecting plate 11 having an I-shape in cross section, which abuts against the attached surface and is fixed to the attached surface, so that the main base 13 vertically projects from the attached surface. The pair of main bases 13 are integrated by a bar-like coupling shaft 23 arranged therebetween and having both end portions held in contact respectively with the pair of main bases 13. The main bases 13 support the mount table 15 and the door drive mechanism 19.

The door drive mechanism 19 and the like are arranged between the pair of main bases 13 facing each other. The mount table 15 includes table fixing portions 27 fixed to the main bases 13, the pod drive mechanism 25 supported by one of the table fixing portions 27, and a pod-support table 29 supported by the pod drive mechanism 25. The pod 2 is placed on and fixed to the pod-support table 29. The pod drive mechanism 25 moves the pod-support table 29 along a direction M perpendicular to an opening portion (not shown) so that the pod 2 is brought close to or separated from the opening portion.

The door drive mechanism 19 supports the door 17 through the intermediation of a door arm 31. The door drive mechanism 19 includes the first door drive unit 33 for driving the door 17 along a first direction D1 toward the opening portion, and the second door drive unit 35 for driving the door 17 along a second direction D2 that is different from the first direction D1. Note that, in this embodiment, the second direction D2 is orthogonal to the first direction D1, and the first direction D1 is set as a horizontal direction while the second direction D2 is set as a vertical direction.

The first door drive unit 33 includes a pair of first guide rails 37, the first drive source 38, a first slider 43, and a first cam follower 47. The pair of first guide rails 37 each extend along the first direction D1 and are fixed to a second slider 53 so as to support the first slider 43 slidably along the first direction D1. The first slider 43 actually supports the door arm 31, and according to the movement of the first slider 43 along the first direction D1, the opening portion is opened and closed by the door arm 31 and the door 17.

Further, the first slider 43 includes a first cam groove 43a arranged so as to extend in a direction orthogonal to the first direction D1. The first cam follower 47 is inserted through the first cam groove 43a. The first cam follower 47 is rotatably supported by the first drive source 38, and a rotational axis of the first cam follower 47 that is caused to rotate by the first drive source 38 faces the first slider 43. Further, the rotational axis is arranged at a position spaced apart from the first cam follower 47, and according to the rotation of the rotational axis, the first cam follower 47 rotates about the rotational axis, that is, performs so-called revolutional movement.

When a plane perpendicular to the rotational axis is assumed as a facing region in the first slider 43 that the rotational axis faces, the plane corresponds to a region of a plane in which the first cam groove 43a extends and the first cam groove 43a is moved by the first cam follower 47. Note that, in this embodiment, a rotary cylinder that operates by using pressurized air (e.g. a pneumatic rotary cylinder) or the like is used as the first drive source 38. Further, the first drive source 38 is fixed to the second slider 53, to which the pair of first guide rails 37 are fixed, by a first fastening unit 49 constituted by an L-shaped arm, screws, and the like. Note that, the first fastening unit 49 is capable of adjusting a fixing position of the first drive source 38 with respect to the first guide rails 37, and hence the first fastening unit 49 also functions as a first-drive-source-position adjustment mechanism for the first drive source 38.

Next, an actual operation of the first door drive unit 33 is described. FIG. 3 illustrates, by the solid lines, the first door drive unit 33 in a state in which the door 17 is stopped at a position at which the opening portion is closed. At this time, the rotary cylinder serving as the first drive source 38 is in a state of a rotational angle of 0°, and the first cam follower 47 is situated in a lower end portion of the first cam groove 43a of FIG. 3. In this state, the first cam follower 47 is situated horizontally with respect to the rotational axis.

When the door 17 is separated from the opening portion along the first direction D1 (direction M), the first drive source 38 pivots the first cam follower 47 along a first rotation direction R1 of FIG. 1 or 4. The pivot operation is performed under the state in which the first cam follower 47 is inserted through the first cam groove 43a. Therefore, at the time of pivoting, the first cam follower 47 is moved in the first cam groove 43a from the lower end to the upper end, and from the upper end to the lower end, and according to the movement, the first cam follower 47 moves the first slider 43 along the first direction D1. Note that, when the first drive source 38 has reached to a rotational angle of 180°, the first cam follower 47 is guided to the lower end of the first cam groove 43a.

As described above, in this embodiment, the rotational axis of the first drive source 38 is arranged at the position facing the first slider 43. More specifically, the first cam groove 43a is, specifically, both the inner peripheral surfaces of the first cam groove 43a are orthogonal to the advancing-and-retracting direction of the door 17, that is, the moving direction of the first slider 43. In addition, tangential lines of the rotation trace of the rotary cylinder at the positions of the rotational angles of 0° and 180° are also orthogonal to the advancing-and-retracting direction of the door 17. With this configuration, at both operational ends of the advancement and retraction of the door 17, the door 17 is prevented from operating unintendedly along the first direction D1.

In other words, the rotational angles of 0° and 180° correspond to the operational end portions of the first slider 43, respectively. Thus, stopping accuracy of the first slider 43 and therefore of the door 17 is improved, with the result that the door 17 is stably stopped with ease. Further, the first slider is moved according to speed components along the first direction D1 resulting from the operations of the first cam follower 47 on the movement traces in the first rotation direction R1 and in the direction opposite thereto.

Therefore, the first slider 43 is moved at the highest speed at the center position that is most separated from stop positions situated at both ends of the moving range, and the moving speed of the first slider 43 decreases as the first slider 43 becomes closer to the stop positions at both the ends. Therefore, the door 17 operates stably in the vicinity of the stop positions, at which stopping abnormality is liable to occur. Further, because of the positional relationship between the rotational axis and the first cam groove 43a, the radius of the movement trace of the first cam follower 47 can be reduced, with the result that torque of the first drive source 38 can be utilized to a great extent.

In this embodiment, the rotary cylinder is used as the first drive source 38. Thus, unlike the case of electrical position control such as motor control, generation of an overload at the time of abnormality can be prevented. Even when the control is alternatively set as the motor control, the effect of improvement in accuracy of the stop position, and the like can be obtained. Further, in this embodiment, the first direction D1 is the horizontal direction, and the first slider 43 is moved in the horizontal direction. However, the present invention is not limited thereto, and the first direction D1 may be inclined with respect to the horizontal direction. In this case, it is only required that the first cam groove 43a intersect a horizontal plane, and the lower portion of the first cam groove 43a, preferably the lower end portion of the first cam groove 43a, correspond to the rotational angles of 0° and 180° in the rotational operation of the first drive source 38.

With this configuration, the first cam follower 47 on which gravity acts can be regulated at the lower end surface of the first cam groove 43a, and when the urging from the rotary cylinder serving as the first drive source 38 is stopped due to, for example, so-called air escape, the first slider 43 and the door 17 maintain their stop positions.

Further, in the present invention, the above-mentioned first-drive-source-position adjustment mechanism (49) is capable of adjusting holding positions of the first slider 43 and the first drive source 38 with respect to the first guide rails 37. In the present invention, an operating range of the door 17 in the first direction D1 is defined by the radius of rotation of the first cam follower 47. Accordingly, even when the stop position of the door 17 is adjusted by the first-drive-source-position adjustment mechanism, the operating range is always constant. In the mini-environment on the side of the semiconductor processing apparatus, to which the load port apparatus 1 is to be mounted, a wafer-transport robot or the like is arranged, and an allowable operating region of the door 17 in the mini-environment is also defined strictly.

However, in the present invention, the operating range of the door 17 is uniquely determined according to the stop position of the door 17, and hence it is unnecessary to perform any complex changing of operation parameters for stopping the door, which has been necessary in the conventional configuration when setting the stop position of the door.

Next, the second door drive unit 35 is described. The second door drive unit 35 includes a pair of second guide rails 39, a second drive source 40, which is sandwiched between the pair of second guide rails 39 and constituted by a rodless cylinder arranged drivably along the second direction D2, and the above-mentioned second slider 53. The rodless cylinder serving as the second drive source 40 raises and lowers the second slider 53 along the second direction D2 (in this embodiment, vertical direction) that is an extending direction of the pair of second guide rails 39.

As described above, the second slider 53 supports the pair of first guide rails 37, and by raising and lowering the second slider 53, the door arm 31 and the door 17 are moved in the vertical direction (direction along the second direction D2). Note that, the configuration of the second door drive unit 35 is not limited to the configuration of this embodiment, and various configurations may be adopted using a publicly known direct-drive system. Further, the second door drive unit 35 may have a configuration conforming to that of the above-mentioned first door drive unit 33.

Further, in the above-mentioned embodiment, regarding the first door drive unit 33, the first slider 43 is moved on the first guide rails 37 linearly extending in the horizontal direction. Alternatively, for example, the first guide rails 37 may be formed into an arc shape to move the first slider 43 along an arc-like trace.

In the mini-environment, a so-called downflow is formed. By moving the first slider 43 along such an arc-like trace, the door 17 can be moved downward of the opening portion more quickly, which may reduce the risk that dust or the like is moved into the pod due to disturbance of the downflow because of the presence of the door 17. Accordingly, it is preferred that the slider of the present invention be movable along a predetermined trace.

In this case, the first cam groove 43a may extend so as to intersect, at a predetermined intersection angle, a straight line connecting one stopping end and another stopping end of the predetermined trace along which the first slider 43 is moved. The preferred effect of the present invention can be obtained by using the first drive source 38 for supplying a rotational force of an axial center, causing the rotational axis to face the first slider 43, and matching the angles at both ends within a predetermined angle range at the time of pivoting with the operational ends of the first slider 43.

Further, with the configuration in which the first cam groove 43a extends so as to intersect the horizontal plane and the first cam follower 47 is situated at the lower end of the first cam groove 43a when corresponding to the angles at both the ends within the predetermined angle range, as described above, the first slider 43 can be maintained in the stopped state with ease against the external force even when the operation of the first drive source 38 is abnormal.

As described hereinabove, the present invention relates to a load port apparatus used suitably to semiconductor processing apparatuses. However, the present invention is applicable not only to the semiconductor processing apparatuses but also to what is called load port apparatuses used for various processing apparatuses in which various processes conforming to those for semiconductors are performed, such as processing apparatuses which handle panels for liquid crystal displays.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-202676, filed Sep. 10, 2010, which is hereby incorporated by reference herein in its entirety.

What is claimed is:

1. A load port apparatus, which is to be mounted to an attached surface of a semiconductor processing apparatus to form an opening portion for insertion and removal of an object-to-be-processed, and which opens and closes a lid of a pod as a sealed container arranged on an outside of the semiconductor processing apparatus with respect to the attached surface so that the object-to-be-processed is insertable into and removable from an inside of the pod through the opening portion, the load port apparatus comprising:
   a mount table on which the pod is to be placed;
   a door which is capable of holding the lid of the pod in a state of being placed on the mount table, the door opening and closing the opening portion from an interior side of the semiconductor processing apparatus with respect to the attached surface; and
   a door drive mechanism which supports the door and causes the door to open and close the opening portion,
   wherein the door drive mechanism comprises:
   a slider which is movable along a predetermined trace and supports the door, the slider comprising a cam groove extending in a direction in which the cam groove intersects, at a predetermined intersection angle, a straight line connecting one end portion and another end portion of the predetermined trace, and
   a drive source of a pneumatic rotary cylinder which supports a cam follower engaging with the cam groove and causes the cam follower to rotate within a predetermined angle range about a rotational center which is a rotational axis arranged at a position spaced apart from the cam follower, and
   wherein the rotational axis of the drive source faces the slider,
   the cam groove intersects with the predetermined trace,
   an operation of the cam follower within the predetermined angle caused by the pneumatic rotary cylinder forms an upwardly convex trace in which the cam follower moves within the cam groove from a lower end of the cam groove to a upper end of the cam groove, and from the upper end of the cam groove to the lower end of the cam groove, and
   the cam follower positions at the lower end of the cam groove in a vertical direction which is a lower end of the predetermined trace when the cam follower is located at both ends of the predetermined angle range.

2. A load port apparatus according to claim 1, wherein, at both ends of the predetermined angle range, the predetermined intersection angle comprises a right angle, and tangential lines of a trace of the rotation of the cam follower are orthogonal to the straight line connecting the one end portion and the another end portion of the predetermined trace.

3. A load port apparatus according to claim 1,
wherein the slider and the drive source of the door drive mechanism constitute a first door drive unit for driving the door in a direction perpendicular to the attached surface, and
wherein the door drive mechanism further comprises a second door drive unit which supports the first door drive unit and drives the first door drive unit in a direction different from the direction in which the first door drive unit drives the door.

4. A load port apparatus, which is to be mounted to an attached surface of a semiconductor processing apparatus to form an opening portion for insertion and removal of an object-to-be-processed, and which opens and closes a lid of a pod as a sealed container arranged on an outside of the semiconductor processing apparatus with respect to the attached surface so that the object-to-be-processed is insertable into and removable from an inside of the pod through the opening portion, the load port apparatus comprising:
a mount table on which the pod is to be placed;
a door which is capable of holding the lid of the pod in a state of being placed on the mount table, the door opening and closing the opening portion from an interior side of the semiconductor processing apparatus with respect to the attached surface; and
a door drive mechanism which supports the door and causes the door to open and close the opening portion,
wherein the door drive mechanism comprises:
a slider which is movable in a horizontal direction and supports the door, the slider comprising a cam groove extending in a vertical direction; and
a drive source constituted by a pneumatic rotary cylinder which comprises a cam follower engaging with the cam groove and causes the cam follower to rotate within a predetermined angle range about a rotational center which is a rotational axis arranged at a position different from a position of the cam follower, and
wherein the predetermined angle range comprises a range from a horizontal angle of 0° to a horizontal angle of 180° through a vertical, upper angle of 90° with respect to the rotational axis,
an operation of the cam follower within the predetermined angle caused by the pneumatic rotary cylinder forms an upwardly convex trace in which the cam follower moves within the cam groove from a lower end of the cam groove to a upper end of the cam groove, and from the upper end of the cam groove to the lower end of the cam groove,
the cam groove intersects with a trace of the operation of the cam follower, and
the cam follower positions at the lower end of the cam groove in a vertical direction which is a lower end of the trace of the operation when the cam follower is located at both ends of the horizontal angle of 0° and the horizontal angle of 180° of the predetermined angle range.

5. A load port apparatus according to claim 4, further comprising a rotary-cylinder-position adjustment mechanism capable of adjusting a position of the rotary cylinder along an advancing-and-retracting direction of the door.

6. A load port apparatus according to claim 4, wherein, at both ends of the predetermined angle range, an extending direction of the cam groove and tangential lines of a trace of the rotation of the cam follower are orthogonal to an operating direction of the slider at a time when the door drive mechanism causes the door to open and close the opening portion.

7. A load port apparatus according to claim 4,
wherein the slider and the drive source of the door drive mechanism constitute a first door drive unit for driving the door in a direction perpendicular to the attached surface, and
wherein the door drive mechanism further comprises a second door drive unit which supports the first door drive unit and drives the first door drive unit in a direction different from the direction in which the first door drive unit drives the door.

\* \* \* \* \*